(12) United States Patent
Huang

(10) Patent No.: US 7,034,737 B1
(45) Date of Patent: Apr. 25, 2006

(54) SWITCHED CAPACITOR CIRCUITS

(75) Inventor: Kuan-Hsun Huang, Douliu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 11/091,073

(22) Filed: Mar. 28, 2005

(51) Int. Cl.
*H03M 1/12* (2006.01)

(52) U.S. Cl. ............ 341/172; 341/144; 341/150; 341/155

(58) Field of Classification Search ............ 341/150, 341/172
See application file for complete search history.

(56) References Cited

U.S. PATENT DOCUMENTS

| | | | | | |
|---|---|---|---|---|---|
| 5,467,089 A | * | 11/1995 | Draxelmayr | ............... | 341/150 |
| 5,574,457 A | * | 11/1996 | Garrity et al. | ............... | 341/172 |
| 5,594,445 A | * | 1/1997 | Ginetti | ............... | 341/162 |
| 5,892,473 A | * | 4/1999 | Shin | ............... | 341/150 |
| 6,097,326 A | * | 8/2000 | Opris et al. | ............... | 341/161 |
| 6,437,720 B1 | * | 8/2002 | Yin et al. | ............... | 341/150 |
| 6,661,283 B1 | * | 12/2003 | Lee | ............... | 330/9 |
| 6,967,509 B1 | * | 11/2005 | Rossi | ............... | 327/124 |

* cited by examiner

*Primary Examiner*—Peguy Jeanpierre
*Assistant Examiner*—Khai Nguyen
(74) *Attorney, Agent, or Firm*—Winston Hsu

(57) ABSTRACT

A switched capacitor circuit includes an amplifier, a first switched capacitor network, and a second switched capacitor network. Either the first or second switched capacitor network is switched in a sampling configuration or a gain configuration according to connection states of the switches thereof. The amplifier includes a first transistor and a second transistor coupled to the first switched capacitor network, and a third transistor and a fourth transistor coupled to the second switched capacitor network. A first switch is coupled to a first connection point of the first and second transistors, and a second switch is coupled to a second connection point of the third and fourth transistors.

13 Claims, 7 Drawing Sheets

US 7,034,737 B1

SWITCHED CAPACITOR CIRCUITS

BACKGROUND

The disclosure relates in general to a switched capacitor circuit. In particular, the disclosure relates to a switched capacitor circuit using an operational amplifier with switches for receiving input signals.

An amplifier typically has an input and an output. The amplifier amplifies a signal applied to the input and provides the amplified signal to the output. In general, amplifiers are characterized by the amount of gain or amplification provided, bandwidth or frequency of operation, noise characteristics, and accuracy of amplification. Amplifiers are commonly used in many different types of circuits, for example, analog to digital converters (ADC).

One type of amplifier is a switched capacitor amplifier. A switched capacitor amplifier is a clocked circuit that operates in discrete steps. For example, in a first phase of a clock cycle a voltage is sampled, in particular, capacitors of a switched capacitor amplification stage are charged to the voltage. Switches are used to couple the capacitors in different configurations. The switches are transmission gates formed from complementary transistor types. In a second phase of a clock cycle, the capacitors of the switched capacitor amplifier are coupled via switches around an amplifier in a configuration to amplify a sampled voltage. The voltages stored on the capacitors in the first phase of the clock cycle determine the magnitude of an output voltage of the amplification stage. The gain is typically fixed by the amplification stage configuration (in the second phase of the clock cycle) and the capacitor values.

Multi-stage pipelined analog to digital converters (ADC) provide efficient high speed conversion of analog signals to digital equivalents. A representative multi-stage pipelined ADC 10 is shown in FIG. 1. The ADC 10 generally includes a plurality of converter stages, such as stages 11, 12 and 13, arranged in series relative to each other. Each converter stage operates by comparing an analog input voltage to thresholds provided by reference signals Vretp and Vrefn. As a result, each converter stage provides one or more bits of digital data to a digital correction circuit 15. The digital correction circuit 15, in turn, resolves the digital output from each stage into a digital output 16 that corresponds to an analog input 17.

FIG. 2 is a generalized block diagram of each converter stage. In operation, each stage accepts an analog input voltage and generates a residual analog voltage and a digital stage output. In particular, each stage applies the analog input voltage to a multiplying digital to analog converter (MDAC) 19 to generate the residual analog voltage. The residual analog voltage is then provided to a comparator 18, which generates the digital stage output. The residual analog voltage also serves as input to subsequent converter stages. This arrangement is also referred to herein as a bit-and-one-half analog to digital converter.

Each stage may include an MDAC as shown in FIG. 3. The MDAC comprises a sampled and hold circuit S/H and a multiplier circuit Mux, operating in accordance with an one cycle clock with phases designated as φ1 and φ2. During a sampling phase φ1, wherein the switches labeled φ1 are closed, sampled and hold circuit S/H samples input voltage Vin. During a subsequent integration phase φ2, wherein the switches labeled φ2 are closed, multiplier circuit Mux amplifies the sampled voltage. The gain of multiplier circuit Mux is set here as two, as an example. Reference voltage (Vref) is either added to or subtracted from the amplified voltage depending on the comparison results. A resulting output voltage (2×Vin±Vref) is then applied to a next amplification stage and the process is repeated such that the sample voltage is pipelined to determine the remaining digital bits sequentially as is well known.

However, MDAC shown in FIG. 3 outputs data when phases φ1 and φ2 are completed, decreasing data transmission efficiency. In addition, MDAC requires two operational amplifiers, consuming power and cost.

FIG. 4 shows another conventional switched capacitor circuit as disclosed in U.S. Pat. No. 5,574,457 to Garrity et al.

MDAC circuit 20 has an input A, an input B, an input VREFMA, an input VREFMB, an input VREFPA, an input VREFPB, an output A, and an output B.

Capacitors C11~C14 and switches coupled thereto correspond to a first sampling circuit for an amplifier 22. Capacitors C11 and C12 receive a voltage from input A. Capacitors C13 and C14 receive a voltage from input B. The voltage difference between input A and B is amplified by an amplifier 22. Capacitors C15~C18 and switches coupled thereto correspond to a second sampling circuit for amplifier 22. Capacitors C15 and C16 receive a voltage from input A. Capacitors C17 and C18 receive a voltage at input B. Capacitors C11~C14 are charged to a voltage (between inputs A and B, and ground) during a first clock phase φ1 while capacitors C15~C18 are coupled around amplifier 22 in a gain configuration, wherein the switches labeled by φ1 are turned on. A differential reference voltage is applied across inputs VREFPA and VREFPB. During a second clock phase φ2, capacitors C15~C18 are charged to a voltage (between inputs A and B, and ground) while capacitors C11~C14 are coupled around amplifier 22 in a gain configuration, wherein the switches labeled by φ2 are closed. A differential reference voltage is applied across inputs VREFMA and VREFMB. Amplifier 22 is operated throughout the clock cycle due to the double sampling process, improving data transmission speed and reducing power.

However, the switches (labeled 24A~24D) connected to the input terminal and inverting input terminal of amplifier 22 comprise resistance, decreasing the operating of amplifier 22.

SUMMARY

An embodiment of a switched capacitor circuit, comprises: a first switched capacitor network operative to output a first input signal; a second switched capacitor network operative to output a second input signal; and an amplifier circuit coupled to a voltage source, comprising: a first output terminal and a second output terminal; a first transistor having a first control gate coupled to the first switched capacitor network, a first first terminal coupled to the first output terminal, and a first second terminal; a second transistor having a second control gate coupled to the first switched capacitor network, a second first terminal coupled to the second output terminal, and a second second terminal; a third transistor having a third control gate coupled to the second switched capacitor network, a third first terminal coupled to the first output terminal, and a third second terminal; a fourth transistor having a fourth control gate coupled to the second switched capacitor network, a fourth first terminal coupled to the second output terminal, and a fourth second terminal; a first switch coupled to a first connection point of the first second terminal and the second second terminal; and a second switch coupled to a second connection point of the third second terminal and the fourth second terminal.

BRIEF DESCRIPTION OF THE DRAWINGS

The invention will become more fully understood from the detailed description, given hereinbelow, and the accompanying drawings. The drawings and description are provided for purposes of illustration only and, thus, are not intended to be limiting of the present invention.

DETAILED DESCRIPTION

Figure 1:
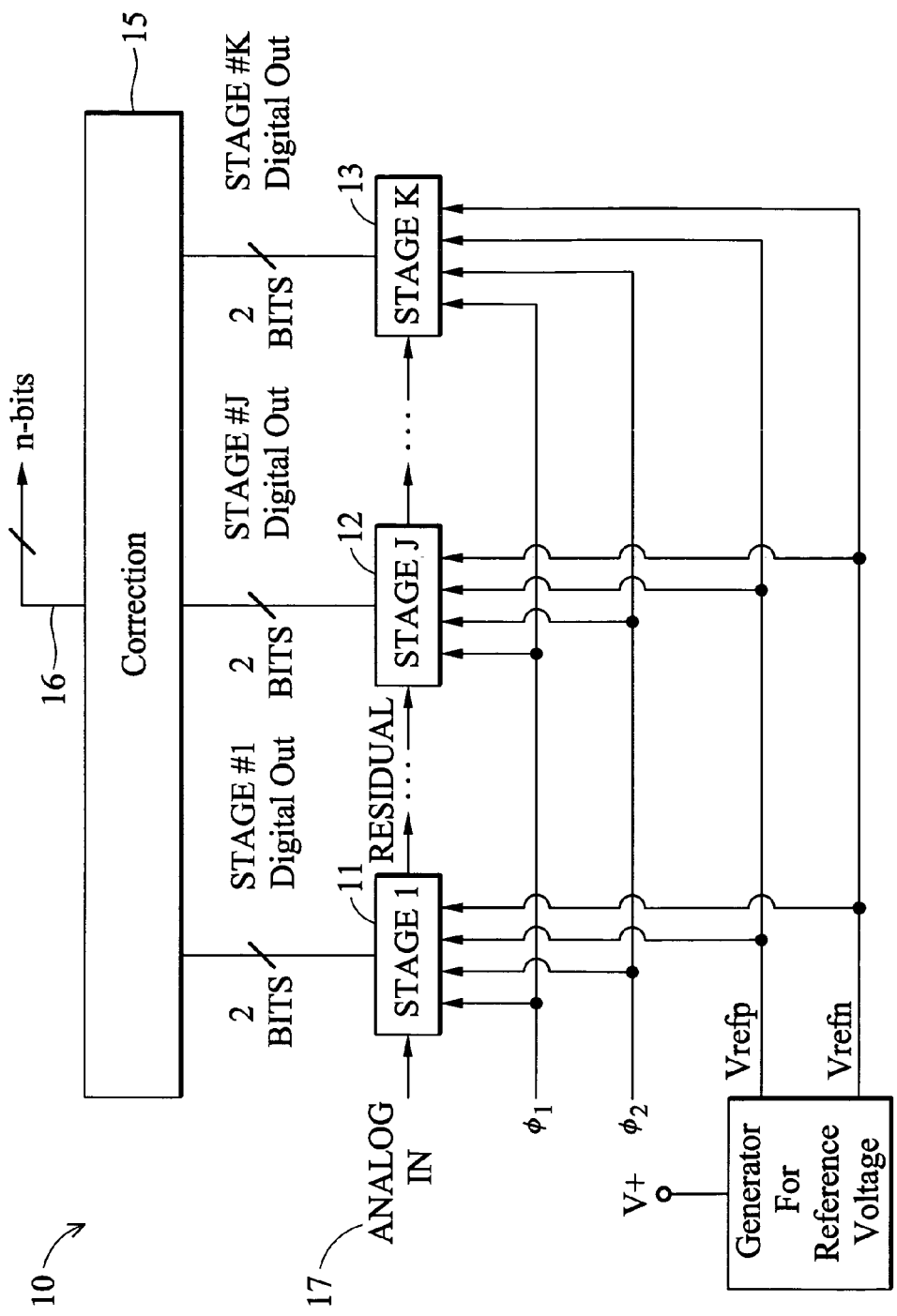
FIG. 1 is a block diagram depicting a conventional multi-stage pipelined analog to digital converter (ADC).
Figure 2:
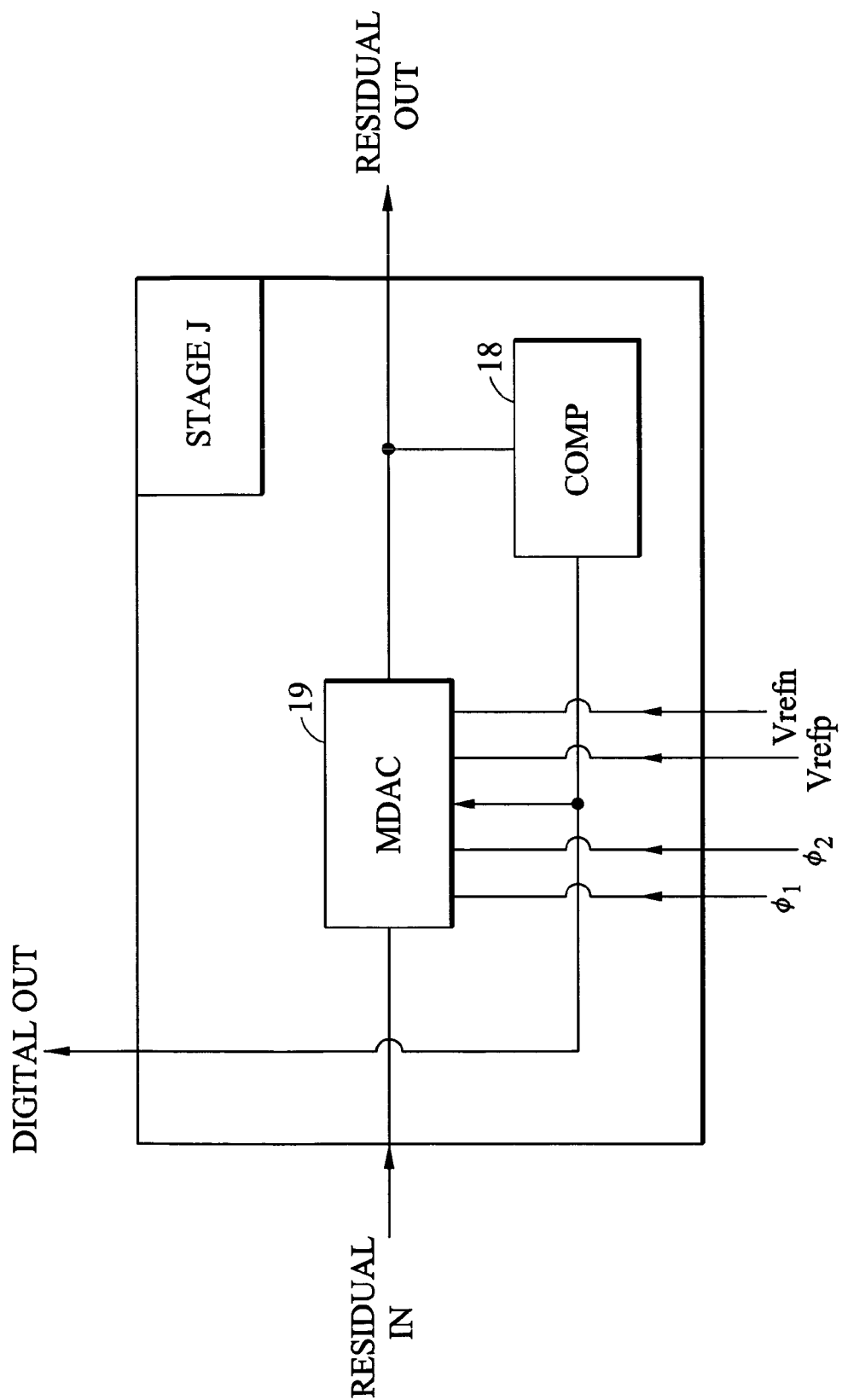
FIG. 2 is a block diagram of an exemplary converter stage residing in the multi-stage ADC.
Figure 3:
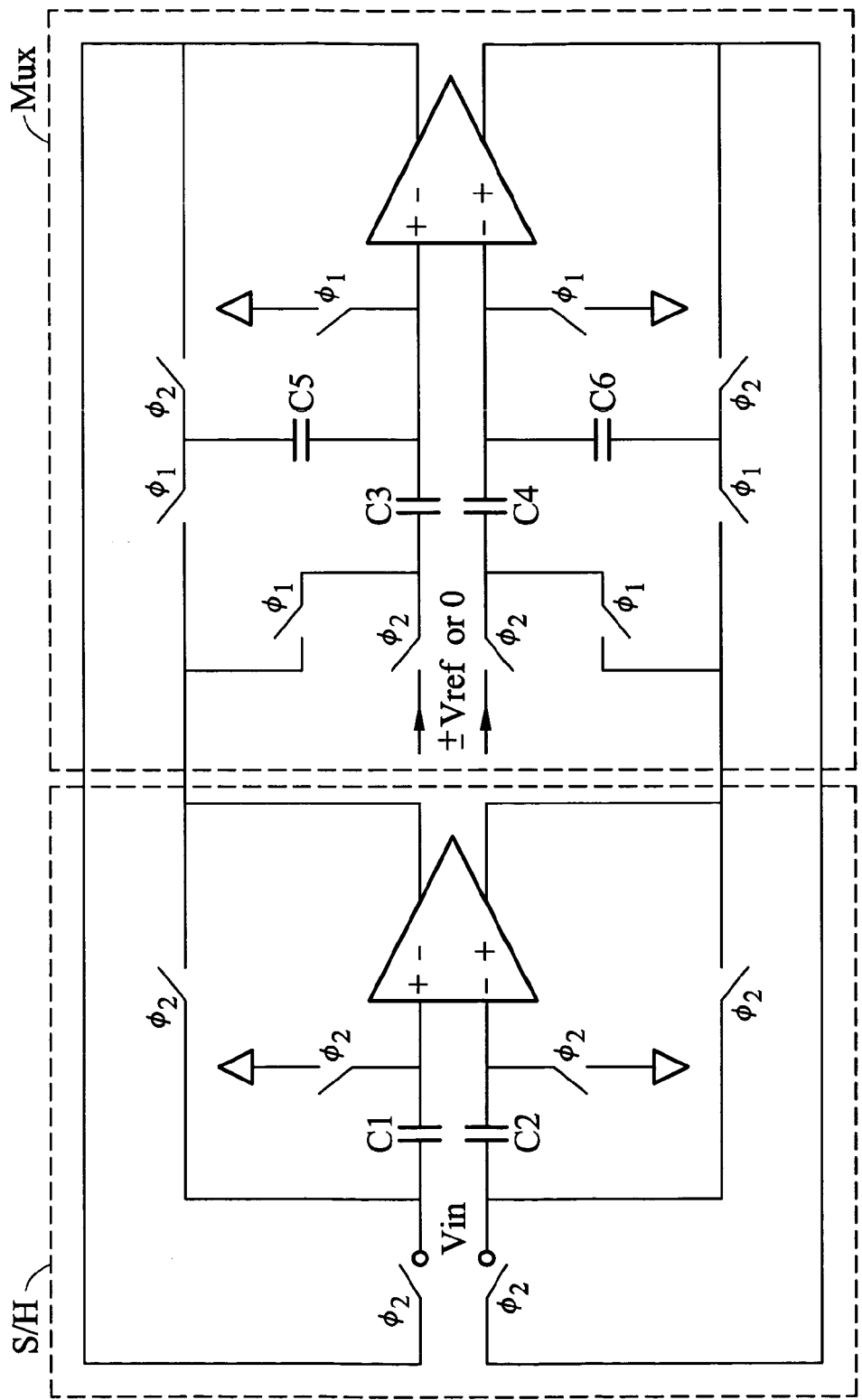
FIG. 3 is a block diagram of a conventional switched capacitor circuit which may be implemented in a converter stage of the multi-stage ADC.
Figure 4:
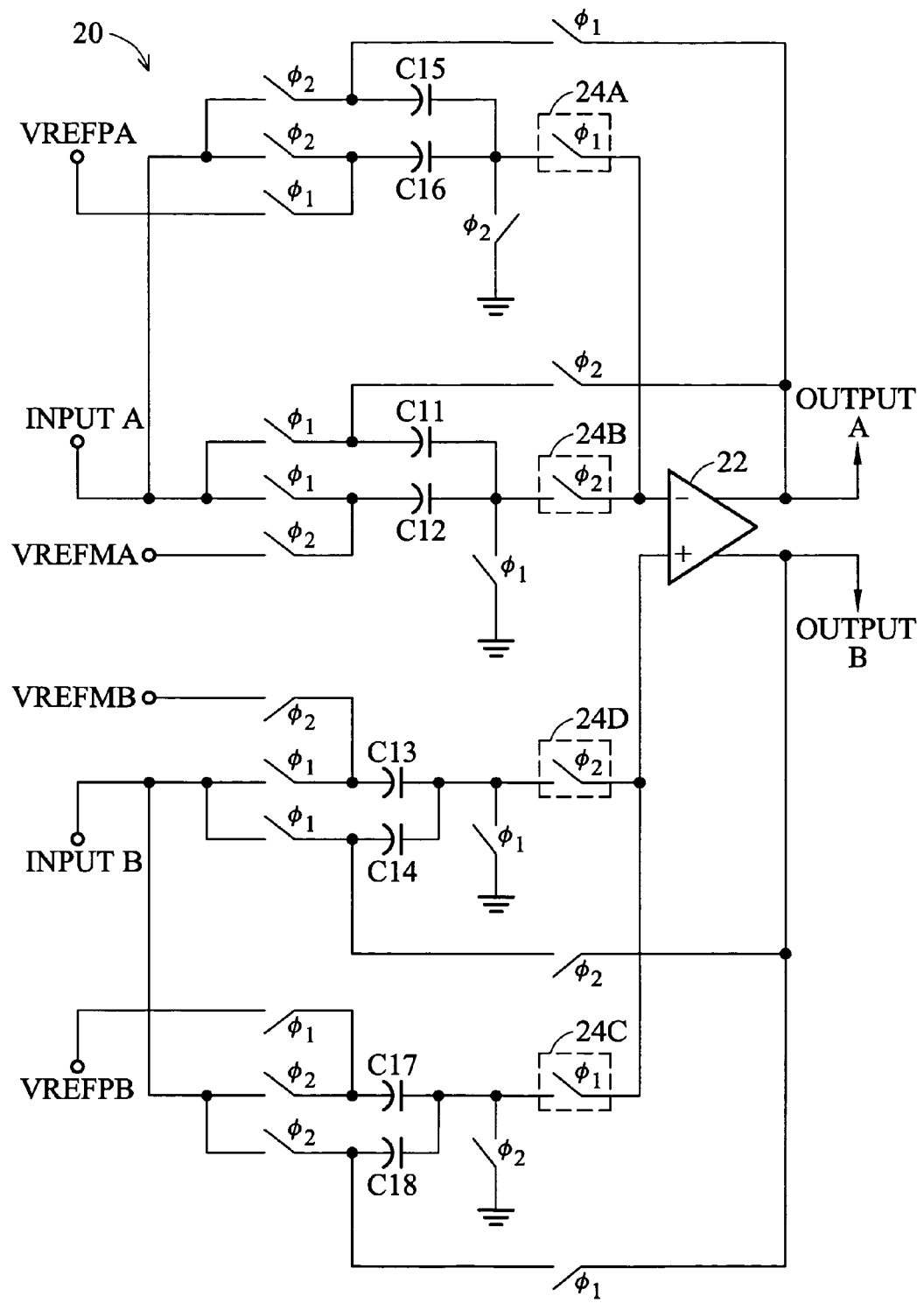
FIG. 4 shows another conventional switched capacitor circuit as disclosed in U.S. Pat. No. 5,574,457 to Garrity et al.
Figure 5:
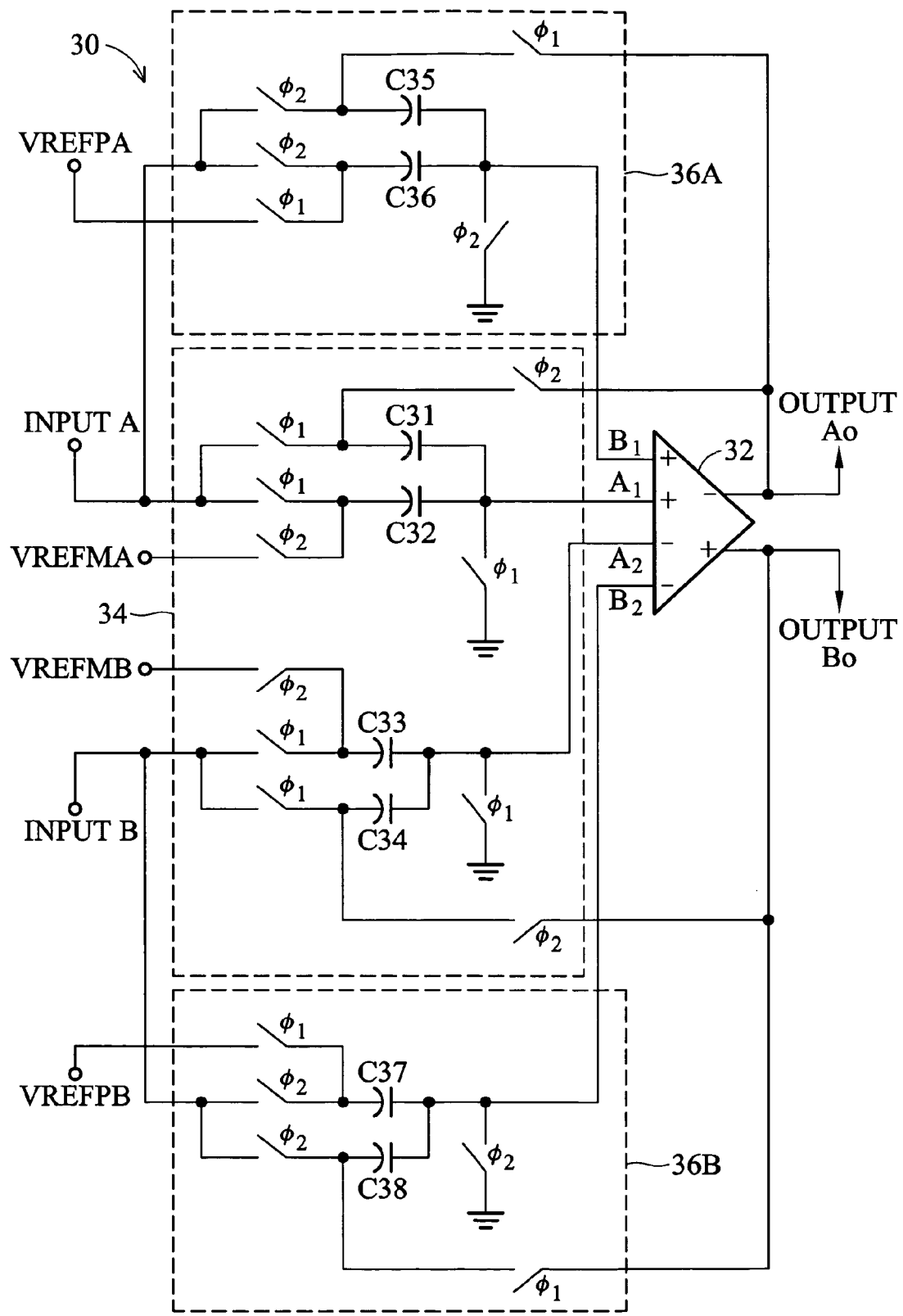
FIG. 5 shows a switched capacitor circuit according to an embodiment of the invention.

FIG. 5 shows a switched capacitor circuit according to an embodiment of the invention, which may be implemented in a stage of a multi-stage ADC. Switched capacitor circuit 30 comprising input A, input B, input VREFMA, input VREFMB, input VREFPA, input VREFPB, output Ao, and output Bo.

Switched capacitor network 34 comprises capacitors C31~C34 and switches. Capacitors C31 and C32 receive a voltage from input A. Capacitors C33 and C34 receive a voltage from input B. The voltage difference between inputs A and B is amplified by an amplifier 32. Switched capacitor network 36 comprises sub-capacitor networks 36A and 36B. Capacitors C35 and C36 receive a voltage from input A. Capacitors C37 and C38 receive a voltage at input B.

Figure 6:
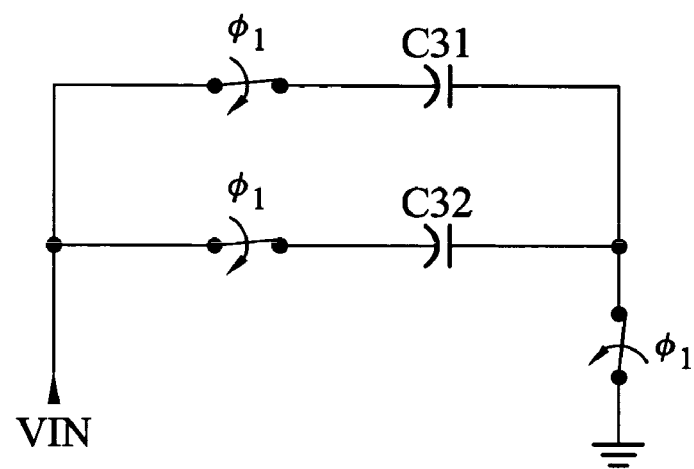
FIG. 6 is a schematic diagram illustrating capacitors C31 and C32 coupled in a sampling configuration.

Capacitors C31~C34 are charged to a voltage (between inputs A and B, and ground) during first clock phase $\phi1$ while capacitors C35-C38 are coupled around amplifier 32 in a gain configuration, wherein the switches labeled by $\phi1$ are turned on. A connection state of the switches is shown in FIG. 6, using the switches corresponding to capacitors C31 and C32 during first clock phase $\phi1$ as an example. As shown in FIG. 6, capacitors C31 and C32 are charged and assume in a sampling configuration.

Figure 7:
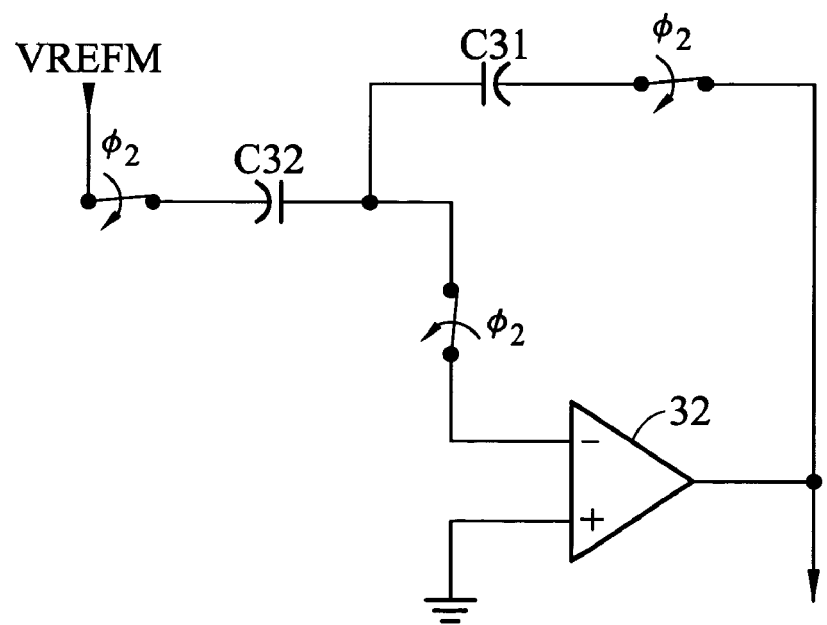
FIG. 7 is a schematic diagram illustrating capacitors C31 and C32 coupled in a gain configuration around an amplifier.

During second clock phase $\phi2$ subsequent to first clock phase $\phi$, capacitors C31~C34 are coupled around amplifier 32 in a gain configuration, wherein the switches labeled by $\phi2$ are turned on. Another connection state of the switches is shown in FIG. 7, using the switches corresponding to capacitors C31 and C32 during second clock phase $\phi2$ as an example. As shown in FIG. 7, capacitors C31 and C32 and amplifier 32 are connected in a gain configuration. A differential reference voltage is applied across inputs VREFMA and VREFMB. Thus, switched capacitor network 34 outputs a first output signal to amplifier 32 according to the amplified input voltage and reference voltage VREFMA and VREFMB in second clock phase $\phi2$.

Capacitors C35~C38 are coupled around amplifier 32 in a gain configuration during first clock phase $\phi1$ while capacitors C31~C34 are charged to a voltage (between inputs A and B, and ground).

During second clock phase $\phi2$, capacitors C35~C38 are charged to a voltage (between inputs A and B, and ground), wherein the switches labeled by $\phi2$ are turned on. Next, during third clock phase $\phi3$ subsequent to second clock phase $\phi2$, the switches labeled by $\phi1$ are turned on, capacitors C35~C38 are coupled around amplifier 32 in a gain configuration while a differential reference voltage is applied across inputs VREFPA and VREFPB. Thus, switched capacitor network 36 outputs a second output signal to amplifier 32 according to the amplified input voltage and reference voltage VREFPA and VREFPB in the third clock phase $\phi3$.

Figure 8:
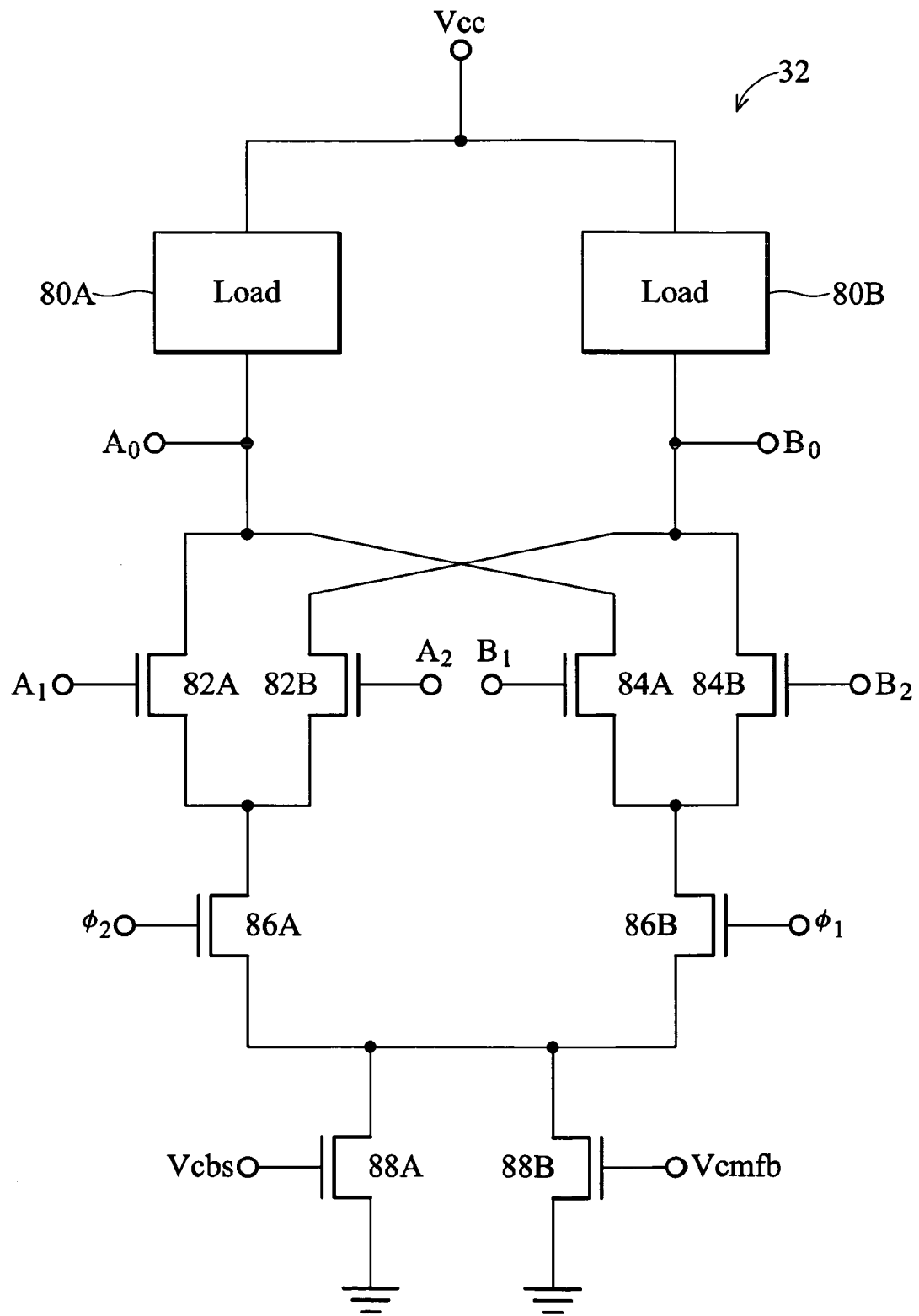
FIG. 8 shows a circuit diagram of amplifier 32 according to an embodiment of the invention.

FIG. 8 is a circuit diagram of amplifier 32 according to an embodiment of the invention. Load 80A is coupled between voltage source VCC and output terminal Ao, and load 80B is coupled between voltage source VCC and output terminal Bo.

NMOS transistor 82A comprises a control gate coupled to switched capacitor network 34, a drain coupled to output terminal Ao, and a source. NMOS transistor 82B comprises a control gate coupled to switched capacitor network 34, a drain coupled to output terminal Bo, and a source. NMOS transistor 84A comprises a control gate coupled to switched capacitor network 36A, a drain coupled to output terminal Ao, and a source. NMOS transistor 84B comprises a control gate coupled to switched capacitor network 36B, a drain coupled to output terminal Bo, and a source.

NMOS transistor 86A is connected to a connection point of NMOS transistors 82A and 82B, and NMOS transistor 86B is connected to a connection point of NMOS transistors 84A and 84B. In an embodiment of the invention, NMOS transistor 86A is turned on during second clock phase $\phi2$, and NMOS transistor 86B is turned on during first clock phase $\phi1$ and third clock phase $\phi3$.

The gate of NMOS transistor 88A is connected to analog bias Vcbs, the drain of NMOS transistor 88A is connected to a connection point of NMOS transistors 86A and 86B, and the source of NMOS transistor 88A is connected to ground. The gate of NMOS transistor 88B is connected to analog bias Vcmfb, the drain of NMOS transistor 88B is connected to a connection point of NMOS transistors 86A and 86B, and the source of NMOS transistor 88B is connected to ground.

Thus, amplifier 32 outputs signals according to the signal output by switched capacitor network 34 during second clock phase $\phi2$, and according to the signal output by switched capacitor network 36 during third clock phase $\phi3$.

As amplifier 32 selectively operates according to the signals output from switched capacitor networks 34 and 36 in response to the switching of the NMOS transistors 86A and 86B, the function of MDAC circuit is achieved. In addition, NMOS transistors 86A and 86B are not connected to the input terminals of amplifier 32, the operating speed of amplifier 32 is not delayed by the resistance of the NMOS transistors 86A and 86B, solving the delay problems of conventional MDAC circuits.

The foregoing description of several embodiments have been presented for the purpose of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A switched capacitor circuit, comprising:
   a first switched capacitor network operative to output a first input signal;
   a second switched capacitor network operative to output a second input signal; and
   an amplifier circuit coupled to a voltage source, comprising:
   a first output terminal and a second output terminal;
   a first transistor having a first control gate coupled to the first switched capacitor network, a first first terminal coupled to the first output terminal, and a first second terminal;
   a second transistor having a second control gate coupled to the first switched capacitor network, a second first terminal coupled to the second output terminal, and a second second terminal;
   a third transistor having a third control gate coupled to the second switched capacitor network, a third first terminal coupled to the first output terminal, and a third second terminal;
   a fourth transistor having a fourth control gate coupled to the second switched capacitor network, a fourth first terminal coupled to the second output terminal, and a fourth second terminal;
   a first switch coupled to a first connection point of the first second terminal and the second second terminal; and
   a second switch coupled to a second connection point of the third second terminal and the fourth second terminal.

2. The switched capacitor circuit as claimed in claim 1, wherein the amplifier circuit further comprises:
   a first load coupled between the voltage source and the first output terminal;
   a second load coupled between the voltage source and the second output terminal; and
   a fifth transistor coupled between a third connection point of the first switch and the second switch, and a ground level.

3. The switched capacitor circuit as claimed in claim 1, wherein the first switched capacitor network comprises a plurality of first capacitors and third switches, and the first capacitors are charged by a first input voltage via the third switches with a first connection state during a first clock phase, assuming a gain configuration with the amplifier circuit via the third switches with a second connection state to amplify the first input voltage during a second clock phase subsequent to the first clock phase.

4. The switched capacitor circuit as claimed in claim 3, wherein the second switched capacitor network comprises a plurality of second capacitors and fourth switches, the second capacitors form the gain configuration with the amplifier circuit via the fourth switches with the second connection state during the first clock phase, the second capacitors are charged by a second input voltage via the fourth switches with the first connection state during the second clock phase, and form the gain configuration with the amplifier circuit via the fourth switches with the second connection state to amplify the second input voltage during a third clock phase subsequent to the second clock phase.

5. The switched capacitor circuit as claimed in claim 3, wherein the first switch is turned on during the second clock phase, and the second switch is turned on during the third clock phase.

6. The switched capacitor circuit as claimed in claim 3, wherein the first switched capacitor network outputs a first output signal to the first control gate according to the amplified first input voltage and a first reference voltage during the second clock phase.

7. The switched capacitor circuit as claimed in claim 6, wherein the amplifier circuit outputs signals according to the first output signal during the second clock phase.

8. The switched capacitor circuit as claimed in claim 3, wherein the second switched capacitor network outputs a second output signal to the second control gate according to the amplified second input voltage and a second reference voltage during the third clock phase.

9. The switched capacitor circuit as claimed in claim 8, wherein the amplifier circuit outputs signals according to the second output signal during the third clock phase.

10. A switched capacitor circuit, comprising:
    a first switched capacitor network, comprising a plurality of first capacitors and first switches, the first capacitors charged by a first input voltage via the first switches with a first connection state during a first clock phase, assuming a gain configuration via the first switches with a second connection state to amplify the first input voltage, and outputting a first output signal according to the amplified first input voltage and a first reference voltage during a second clock phase subsequent to the first clock phase;
    a second switched capacitor network comprising a plurality of second capacitors and second switches, the second capacitors assuming the gain configuration via the second switches with the second connection state during the first clock phase, charged by a second input voltage via the second switches with the first connection state during the second clock phase, and assuming the gain configuration via the second switches with the second connection state to amplify the second input voltage, outputting a second output signal according to the amplified second input voltage and a second reference voltage during the third clock phase subsequent to the second clock phase; and
    an amplifier circuit coupled to a voltage source, comprising:
    a first output terminal and a second output terminal;
    a first transistor having a first control gate coupled to the first switched capacitor network, a first first terminal coupled to the first output terminal, and a first second terminal;
    a second transistor having a second control gate coupled to the first switched capacitor network, a second first terminal coupled to the second output terminal, and a second second terminal;
    a third transistor having a third control gate coupled to the second switched capacitor network, a third first terminal coupled to the first output terminal, and a third second terminal;
    a fourth transistor having a fourth control gate coupled to the second switched capacitor network, a fourth first terminal coupled to the second output terminal, and a fourth second terminal;

a third switch coupled to a first connection point of the first second terminal and the second second terminal, and turned on during the second clock phase; and a fourth switch coupled to a second connection point of the third second terminal and the fourth second terminal, and turned on during the third clock phase.

11. The switched capacitor circuit as claimed in claim 10, wherein the amplifier circuit further comprises:

a first load coupled between the voltage source and the first output terminal;

a second load coupled between the voltage source and the second output terminal; and a fifth transistor coupled between a third connection point of the first switch and the second switch, and a ground level.

12. The switched capacitor circuit as claimed in claim 10, wherein the amplifier circuit outputs signals according to the first output signal during the second clock phase.

13. The switched capacitor circuit as claimed in claim 10, wherein the amplifier circuit outputs signals according to the second output signal during the third clock phase.

* * * * *